United States Patent [19]
Miller et al.

[11] Patent Number: 5,861,742
[45] Date of Patent: Jan. 19, 1999

[54] ELECTRIC METER COVER

[75] Inventors: David J. Miller, S. Berwick, Me.; Warren R. Germer, Hampton, N.H.; Raymond E. Fearnley, Rochester, N.H.; Rajiv D. Katwala, Dover, N.H.

[73] Assignee: General Electric Company, Schenectady, N.Y.

[21] Appl. No.: 565,506

[22] Filed: Nov. 30, 1995

[51] Int. Cl.⁶ .................................................... G01R 1/04
[52] U.S. Cl. .......................................... 324/156; 324/155
[58] Field of Search ................................ 324/156, 155; 73/431

[56] References Cited

U.S. PATENT DOCUMENTS

| | | | |
|---|---|---|---|
| 2,419,100 | 4/1947 | Weaver . | |
| 3,628,096 | 12/1971 | Drew, Jr. et al. | 324/156 X |
| 3,664,445 | 5/1972 | Conklin | 177/45 |
| 3,834,029 | 9/1974 | Stiebel | 33/3 C |
| 3,857,285 | 12/1974 | Atlag et al. | 73/431 X |
| 4,096,377 | 6/1978 | Prentice et al. | 235/144 HC |
| 4,106,344 | 8/1978 | Moll | 73/431 |
| 4,163,939 | 8/1979 | Halstad et al. | 324/156 X |
| 4,920,799 | 5/1990 | Low | 73/431 |
| 5,057,767 | 10/1991 | Keturakis et al. | 324/156 X |
| 5,184,064 | 2/1993 | Vicknair et al. | 73/431 X |
| 5,359,165 | 10/1994 | Leveque et al. | 200/317 |
| 5,469,482 | 11/1995 | Vardenberg et al. | 377/3 |
| 5,473,504 | 12/1995 | Horan et al. | 361/667 |

*Primary Examiner*—Thomas P. Noland
*Attorney, Agent, or Firm*—Fishman, Dionne, Cantor & Colburn

[57] ABSTRACT

An electric meter cover of an integrally molded construction which reduces cost of manufacture and increases performance by reducing number of seals required. The cover of the invention includes provision for an optic probe, a viewing window and a reset arrangement allowing the meter to be reset without removing the cover and in a one movement operation, which simplifies the reset operation.

17 Claims, 4 Drawing Sheets

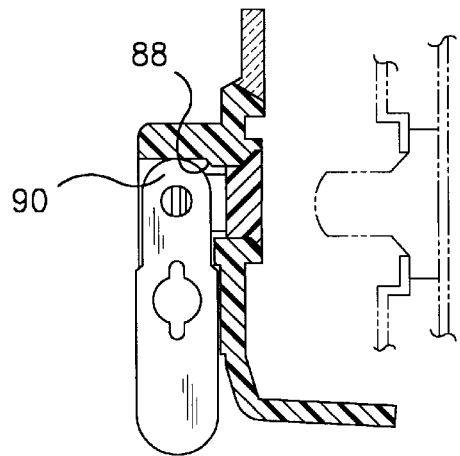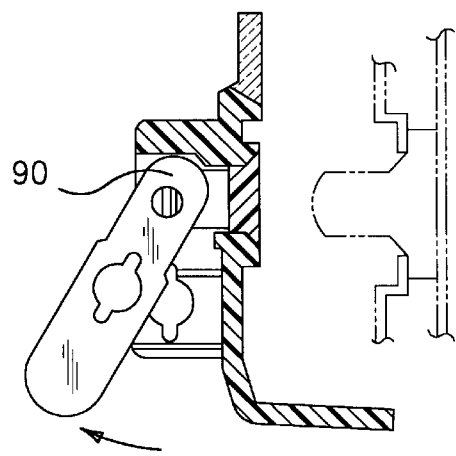
*FIG. 5A*   *FIG. 5B*
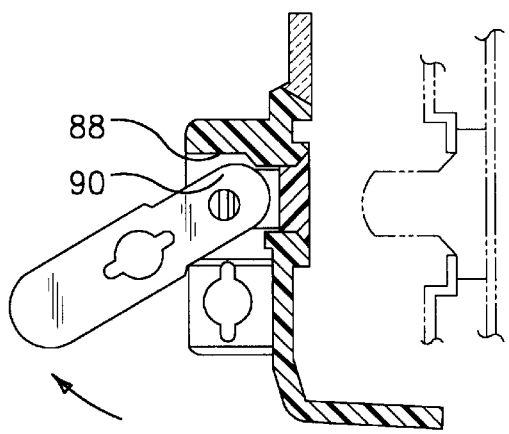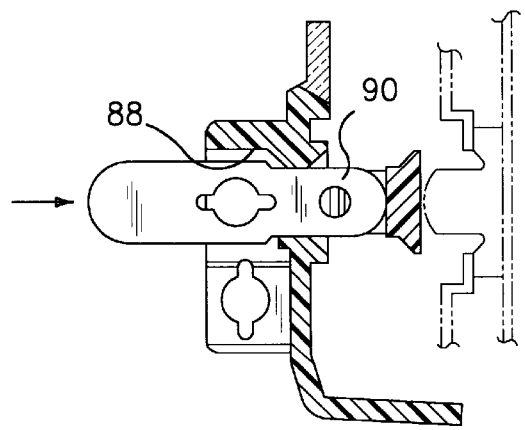
*FIG. 5C*   *FIG. 5D*

ELECTRIC METER COVER

BACKGROUND OF THE INVENTION

1. Field of the Invention

The present invention relates to the field of electricity meter covers, and, more particularly, to an integrally molded electricity meter cover including a reset arrangement.

2. Prior Art

A typical electronic watthour meter for measuring electric energy consumption requires resetting of the demand function after periodic reading of the meter, such as every month. The reset is typically accomplished by activating a reset switch located somewhere on the meter itself and under the cover. Generally the reset switch (or button) is actuated by depressing a plunger positioned in proximity to the button and extending through the cover. For example, an early prototype version of the General Electric EVX meter produced by the assignee of the present invention, included a plunger carried by the housing. The plunger, once rotated 90° to an activate position, could be depressed by the technician or meter reader to activate the reset switch positioned inside the meter cover to thereby reset the meter.

Tampering with the reset plunger is typically discouraged by the provision of a switch cover or latch cover for the plunger. The switch cover is typically pivotally connected to the meter housing and is movable between open and closed positions. In the open position, the plunger may be rotated and depressed to reset the meter. In the closed position, activation of the plunger is not possible, since the plunger cannot be rotated or depressed. Moreover, the switch cover typically allows for a wire, band or padlock seal to be used to secure the switch cover in the closed position.

The early prototype EVX meter, for example, included a plunger having a thumbgrip portion which permitted the technician to grasp and then rotate the plunger. The thumbgrip portion included a circular opening in communication with a slotted opening thereby permitting insertion of either a padlock or tape seal. The latch cover of this early prototype meter had a rectangular cutout roughly aligned with the openings in the plunger. Accordingly, a seal or padlock would retain the latch cover in the closed position and prevent operation of the plunger. Unfortunately, the padlock or seal of the early EVX meter was supported only by the thumbgrip portion of the plunger. Accordingly, the plunger could be damaged by manipulation of the seal or padlock thereby requiring replacement of the plunger.

The switch cover of the early EVX meter was snapped in place on a hinge pin integrally molded into the housing or meter cover. In addition, an external bump was molded on an outer portion of the switch cover to attempt to provide means for holding the latch cover in the open position when the plunger was accessed by a technician. The convenience of the technician is enhanced if the cover may be secured in the open position. Unfortunately, the early EVX meter cover latch did not provide the desired positive locking in the open position. Moreover, the typical plastic materials used for a meter housing and for the associated switch cover and hinge pin may be susceptible to both molded-in stresses and stresses produced during operation. These stresses are amplified particularly in the presence of notches, nicks, cuts, etc. Environmental influences may also degrade the typical polycarbonate plastic material and may lead to a failure of the switch cover to remain in the open position.

Another disadvantage of the early EVX meter resulted from the hinge portion of the switch cover defining an exposed opening for moisture and dirt to enter into the area between the hinge pin and hinge portion. Accordingly, the long term reliability of the hinge may suffer.

Another prior art arrangement includes a housing, a switch means positioned within an opening in said housing, a hinge pin connected to the meter housing and a switch means cover pivotally connected to the hinge pin and adapted to prevent actuation of the switch means when closed and to permit such actuation when open. While the apparatus is well suited to its intended purpose, it does require two operations to reset the meter, i.e., opening of the switch cover and rotating of the switch means before that means is appropriately configured to be used to reset the meter. Moreover, the unit requires considerable assembly time translating to costly manufacture.

Other prior art arrangements have included a number of parts associated with the reset mechanism. For example, one arrangement utilizes six parts for the reset alone: the hasp is ultrasonically welded onto the cover and the mechanism further includes a latch, a pin, a shaft, a plunger and a gasket. As can easily be appreciated, the number of parts creates cost. In yet another arrangement a machined hasp is attached by threads, gaskets, a pair of flat washers, a lockwasher and a nut, and this is only for the hasp. To complete the reset arrangement, a latch and plunger including a metal latch, a pin, a plunger, a a washer, a at least one gasket and a screw to hold the plunger on the rest of the arrangement. Clearly a formidable number of parts for a relatively simple operation. Still another prior art arrangement comprises a welded on hasp (in fact a two piece structure itself) and a preassembled plunger having a metal latch, a spring to hold the latch up and a separate piece to hold the latch again to many pieces and therefore less desirable than the present invention as discussed hereinbelow.

SUMMARY OF THE INVENTION

The above-discussed and other drawbacks and deficiencies of the prior art are overcome or alleviated by the electric meter cover of the invention.

These and other objects, features and advantages of the present invention are provided by an electric meter cover including an integrally molded housing, an optional reset arrangement positioned within an opening in the housing, an optional light pipe arrangement and an optional lockdown tab for preventing access to the reset arrangement. It will be appreciated that the preferred embodiment includes all options.

The invention reduces cost of manufacture by providing an integrally molded cover having the housing structure, viewing window and light pipe arrangement as a single piece of polycarbonate or acrylic, the window and light pipes being of optical quality due to selectively polished and selectively textured mold surfaces. The housing is also integrally molded with an opening for accepting the two piece resetting arrangement and the tab to lock the resetting arrangement. Cost is reduced by avoiding sealing materials, assembly time and additional molding of various other parts.

Reliability is improved due to the reduction in the number of seals employed and elimination of assembly tolerances. The resetting arrangement of the invention provides a single movement operation improving efficiency and saving time.

The above-discussed and other features and advantages of the present invention will be appreciated and understood by those skilled in the art from the following detailed description and drawings.

BRIEF DESCRIPTION OF THE DRAWINGS

Referring now to the drawings wherein like elements are numbered alike in the several FIGURES:

FIGS. 5A–D is a sequential cross section view of a second embodiment of the resetting arrangement of the invention.

DETAILED DESCRIPTION OF THE PREFERRED EMBODIMENT

Figure 1:
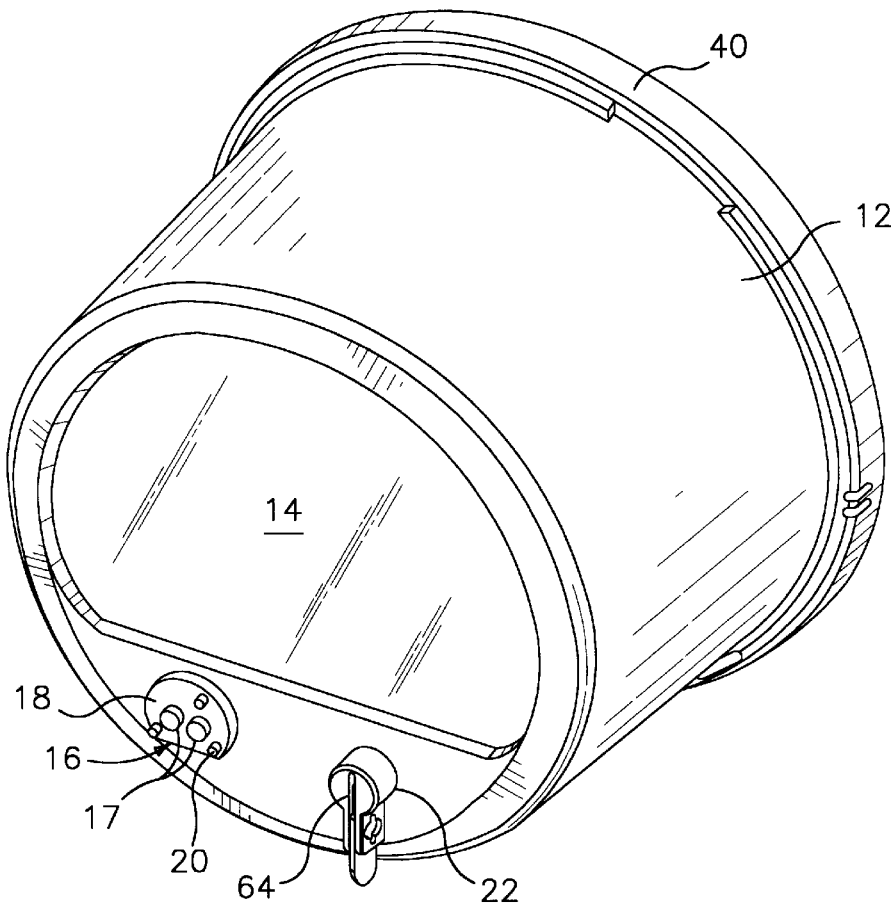
FIG. 1 is a perspective view of an electric meter cover according to the invention.
Figure 2:
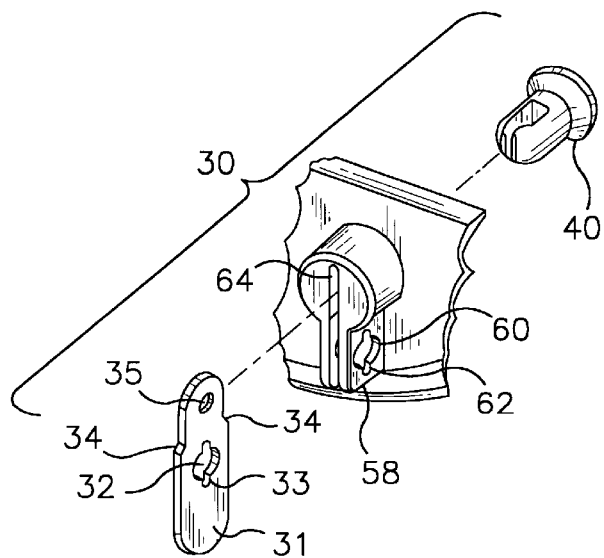
FIG. 2 is an extracted exploded perspective view of the reset arrangement of the invention.
Figure 3A:
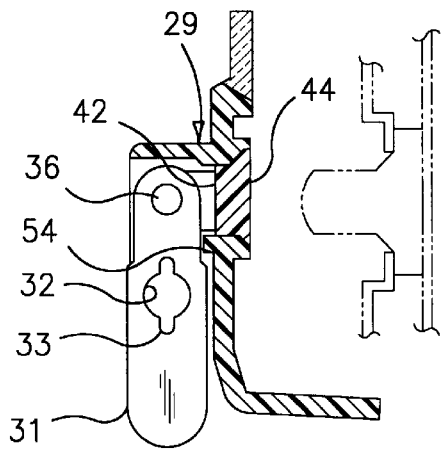
FIG. 3A is an elevational view of the reset arrangement in the housing in the latched position.
Figure 3B:
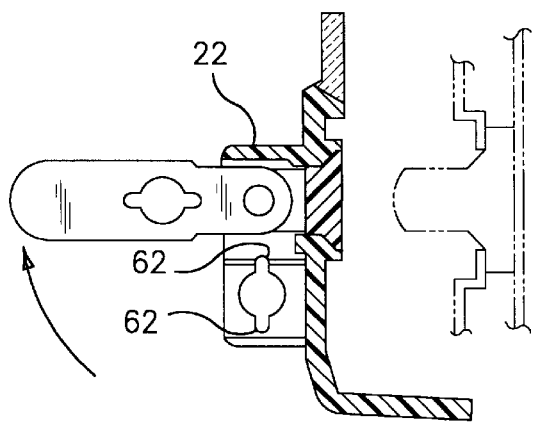
FIG. 3B is an elevational view of the reset arrangement in the open position.
Figure 3C:
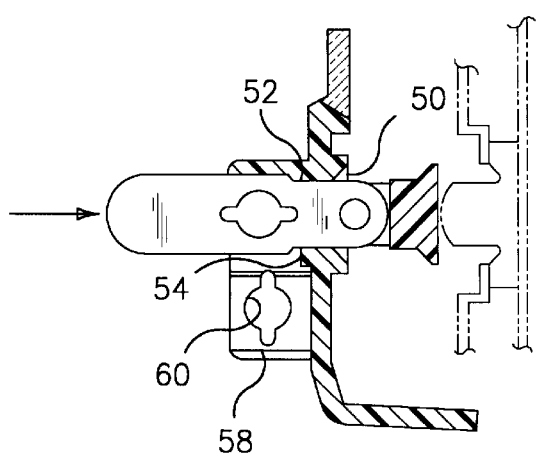
FIG. 3C is an elevational view of the reset arrangement in the depressed/reset position.
Figure 3D:
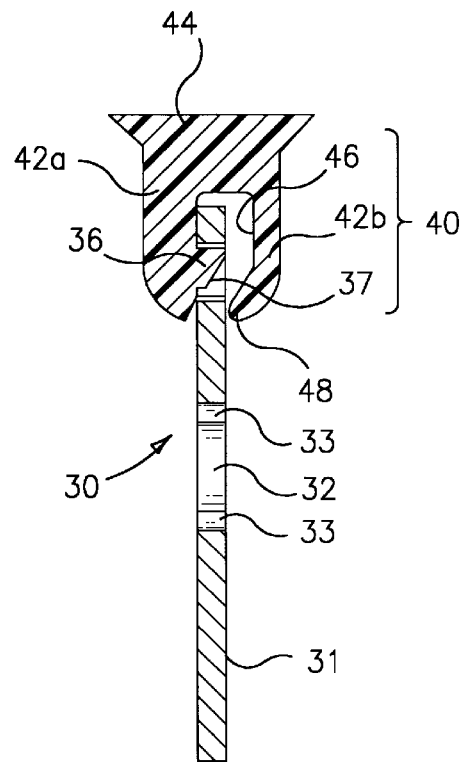
FIG. 3D is a top view of the reset arrangement.
Figure 4:
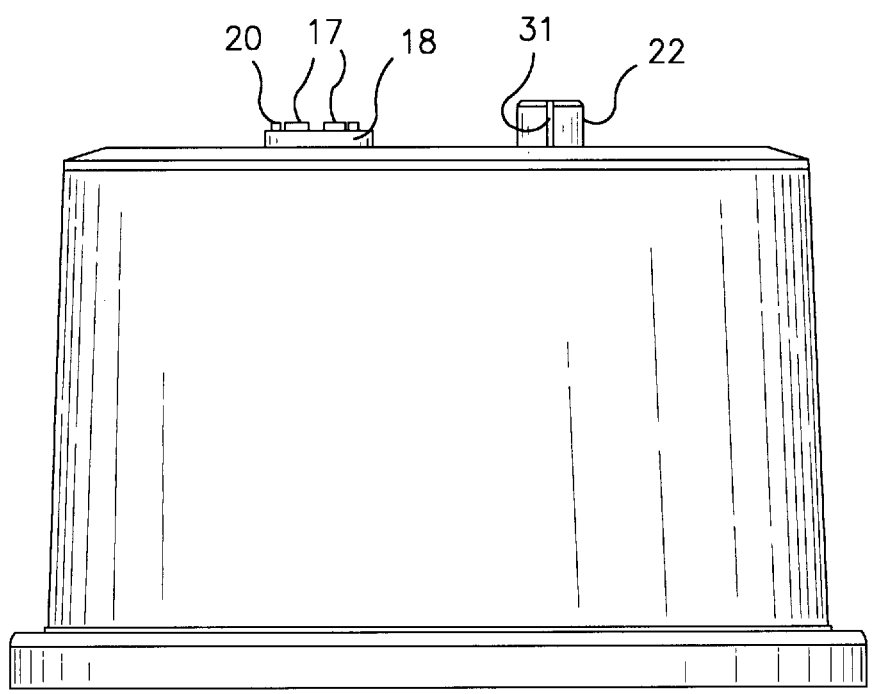
FIG. 4 is a bottom plan view of the cover.

Initially, it should be noted that in a prior art resetting arrangement, up to thirteen individual parts are employed to effect the intent of the device. This and other labor and cost-intensive designs have brought a desire for a simpler arrangement such as the two-piece arrangement of the present invention.

Referring to FIGS. 1,2 and 3A–3D, the cover 10 is composed of housing 12 having viewing window 14, light pipe arrangement 16, lock tab 22 and reset arrangement receptacle 29 for a resetting arrangement 30. Housing 12 is constructed preferably by injection molding of polycarbonate or acrylic material in a mold which is selectively polished and selectively textured to create the desired surface features of the cover. The optically quality portions are, of course, window 14 and light pipes 17 of arrangement 16, the former for viewing the meter device (not shown) and the latter for employment of an optics probe (not shown). All other areas of housing 12 are textured in the mold to a minimum of about 0.003 inch deep to obscure visibility through the cover. Because of the one piece construction, seals are avoided which not only reduces cost of assembly and materials but additionally avoids damage to the meter caused by leakage which is always a threat when seals are employed.

Base area 40 of housing 12 includes latches commonly employed in the art to make the cover of the invention easily retrofittable to existing meters.

Light pipe arrangement 16 is of a conventional arrangement except that additional molding steps and assembly are avoided by the integrally molded construction of the invention. Moreover, the integrally molded part possesses superior strength and durability compared to assembled parts. Arrangement 16 includes light pipes 17 nestled in pedestal 18 and extending above the pedestal a predetermined amount to render the ends of pipes 17 flush with a magnet plate (conventional in the art and not shown) which is affixed to the pedestal preferably by deforming distal ends of stakes 20 subsequent to placing the plate on pedestal 18. The integral molding of the arrangement 16 avoids the steps of inserting light pipes 17 and bonding them in place thus realizing a cost savings.

Referring to FIGS. 2, 3A, 3B and 3C, the resetting arrangement 30 is adapted to provide a one movement reset while also providing a weather tight engagement with reset arrangement receptacle 29 in housing 12. Considering arrangement 30 first, and referring specifically to FIG. 2, arrangement 30 comprises two interlocking structures. Latch 31 includes lock passage 32 and band satellites 33 extending from passage 32. Latch 31 further includes shoulders 34 and engagement aperture 35. Aperture 35 is dimensioned to be occupied by pivot 36 which is a part of plunger 40. It should be noted that pivot 36 preferably includes ramp 37 to facilitate engagement of the latch.

Plunger 40 includes a cylindrical body 42 which is coextensive with a frustoconical form oriented to increase in circumferential dimension while extending from the intersection between body 42 and frustocone 44. Body 42 is bisected to allow for insertion of latch 31 from within the bisected side 42a, pivot 36 protrudes toward side 42b of bisected body 42 (see FIG. 3D). Ramp 37 is preferably oriented away from frustocone 44 to ease insertion of latch 31. Side 42b, it will be appreciated, provides undercut 46 to a predetermined extent to allow side 42b sufficient resiliency to deform upon insertion of latch 31 and return after engagement thereof. Side 42b further includes retainer point 48 at a distal end thereof to retain latch 31 in the desired orientation.

At least the frustocone of plunger 40 is composed of a deformable resilient material such that upon withdrawal of plunger 40 to its locked position (discussed hereunder) frustocone 44 mates sealingly with chamfer 50 of receptacle 29. It is preferable, however, to mold plunger 40 of one material to reduce manufacturing costs. It should be noted that frustocone 44 is solid at at least its largest diametrical dimension providing a surface with which to depress the reset switch in the meter. As is clear to one of skill in the art, resetting arrangement 30 is the sum of plunger 40 and latch 31.

Resetting arrangement 30 communicates with receptacle 29 to provide the desired function. Receptacle 29 itself comprises an aperture 52 in housing 12, which aperture is coextensive with chamfer 50. Receptacle 29 further includes fulcrum 54 positioned advantageously at the exterior edge of aperture 52 and extending outwardly from the surface of housing 12 as shown.

It will be appreciated that initial assembly of arrangement 30 requires insertion of latch 31 into aperture 52 from outside of cover 10 and then engagement of plunger 40 onto latch 31 from the inside of cover 10. Once engaged, arrangement 30 cannot be removed from receptacle 29 without disassembling arrangement 30.

In use, after unlocking as discussed hereunder, the latch 31 is lifted thereby axially aligning it with plunger 40 and the arrangement is urged inwardly from the exterior of cover 10 to the interior thereof. As this movement is continued frustocone 44, at its largest diametrical dimension, contacts and depresses reset switch 56 (illustrated schematically in FIGS. 3A–D) to reset the meter (not shown). Arrangement 30 cannot be pushed through aperture 52 due to the existence of shoulders 34 which possess a wider planar dimension than the diametrical dimension of aperture 52. Therefore, there is no danger of dropping the arrangement into the cover, requiring extensive labor to remove. This is not the case with prior art arrangements which could be dropped and is therefore a significant improvement for the meter servicing industry. After the resetting operation, the latch 31 is withdrawn; this seats frustocone 44 in chamfer 50 and seals the receptacle 29 from exterior environmental conditions. Assisting in providing a tight seal is fulcrum 54 which, as shown, is positioned such that when latch 31 is lowered to the locking position, plunger 40 is tightly urged into chamfer 50 due to the levering action of latch 31 over fulcrum 54.

Referring to FIG. 1 lock tab 22 is illustrated. In the most preferred embodiment lock tab 22 is molded integrally with housing 12 to reduce manufacturing costs and is from the front view similar to a skeleton key hole configuration. The lower part 58 of the "key hole" provides the lock opening 60 with band satellites 62 and the upper part 64 of the "key hole" provides guidance for latch 31 during the resetting operation. Moreover, the "key hole" shape itself provides increased strength and durability for the lock tab. Upon being placed into the locking position latch 31 may be tamper treated by passing a lock through the latch 31 and lock tab 22 or by passing a band or other tamper device therethrough if desired.

In another embodiment of the resetting arrangement of the invention, as illustrated in FIGS. 5A–D, the latch 31 has been reoriented to rotate eccentrically. It will also be appreciated that the upper part 64 of the keyhole has been radiused to receive the eccentric movement of the latch 31. Radiused section 88 both receives the end 90 of latch 31 and resultingly prevents the resetting of the meter by unauthorized persons who otherwise might be able to slightly move the latch, even when locked, and still be successful. Such resetting is prevented because the latch end 90 abuts against section 88 until it is completely aligned. It will be appreciated by one of skill in the art that in order for the longer end 90 of this embodiment to pass through the arc of its intended movement, the radiused section 88 must cut more deeply into the cover (even so the apex of the end 90 is always in contact with the section 88 until complete alignment is achieved. In this embodiment, it is not possible to reset the meter until the latch 31 is in the fully horizontal position and fully aligned with the plunger. In all other respects the resetting arrangement of this embodiment is the same as the previous embodiment. For clarity and to further emphasize the differences of this embodiment over the previous embodiment FIGS. 5A–D is only numbered as to the differences.

The invention provides substantial manufacturing cost savings in the form of reduced materials, personnel hours and assembly operations. Moreover, the invention provides a reliable and simple resetting arrangement which is a one movement maneuver. This is important to the relevant art and, therefore, is a significant benefit thereto.

While preferred embodiments have been shown and described, various modifications and substitutions may be made thereto without departing from the spirit and scope of the invention. Accordingly, it is to be understood that the present invention has been described by way of illustration and not limitation.

What is claimed is:

1. An electric meter cover comprising:
   a) an integrally molded housing including a viewing window, a light pipe arrangement and a resetting arrangement receptacle; and
   b) a resetting arrangement engageable with said receptacle.

2. An electric meter cover as in claim 1 wherein said arrangement includes a plunger having a frustoconical end portion and body portion; said frustoconical end portion being matable with said housing in a chamfer defined by said housing.

3. An electric meter cover as claimed in claim 2 wherein said arrangement further includes a latch attached to said plunger.

4. An electric meter cover as claimed in claim 3 wherein said latch is pivotally attached to said plunger.

5. An electric meter cover as claimed in claim 4 wherein said housing further includes a fulcrum contactable by said latch to bias said plunger into said chamfer.

6. An electric meter cover as claimed in claim 3 wherein said housing further includes an integrally molded lock tab having an opening therein which opening is alignable with a similarly dimensioned opening in said latch.

7. An electric meter cover as claimed in claim 3 wherein said latch is metal.

8. An electric meter cover as claimed in claim 3 wherein said latch is plastic.

9. An electric meter cover as claimed in claim 2 wherein said plunger is plastic.

10. An electric meter cover as claimed in claim 9 wherein said plastic is a thermoplastic.

11. An electric meter cover as claimed in claim 9 wherein said plastic is elastomeric.

12. An electric meter cover as claimed in claim 1 wherein said light pipe arrangement includes means for mounting a metallic plate thereon having through holes for passage of at least one light pipe.

13. An electric meter cover as claimed in claim 12 wherein said means for mounting is at least one plastic stake deformable at a distal end to secure said plate to said light pipe arrangement.

14. An electric meter cover as claimed in claim 1 wherein said cover further includes an integrally molded lock tab.

15. An electric meter cover comprising an integrally molded housing and light pipe arrangement.

16. An electric meter cover comprising an integrally molded housing, viewing window and light pipe arrangement.

17. An electric meter cover as claimed in claim 16 wherein said cover further includes an integrally molded lock tab.

* * * * *